(12) United States Patent
Lee et al.

(10) Patent No.: US 8,111,518 B2
(45) Date of Patent: Feb. 7, 2012

(54) ELECTRONIC DEVICE

(75) Inventors: Tung-Ping Lee, Taipei (TW); Yu-Ling Kuo, Taipei (TW)

(73) Assignee: Wistron Corp., New Taipei (TW)

(*) Notice: Subject to any disclaimer, the term of this patent is extended or adjusted under 35 U.S.C. 154(b) by 812 days.

(21) Appl. No.: 12/197,154

(22) Filed: Aug. 22, 2008

(65) Prior Publication Data

US 2009/0091901 A1 Apr. 9, 2009

(30) Foreign Application Priority Data

Oct. 9, 2007 (TW) .............................. 96216882 U

(51) Int. Cl.
*H05K 7/12* (2006.01)

(52) U.S. Cl. ......... 361/759; 361/801; 361/747; 361/726

(58) Field of Classification Search .................. 361/740, 361/741, 747, 759, 807, 732, 726, 801
See application file for complete search history.

(56) References Cited

U.S. PATENT DOCUMENTS

| | | | | |
|---|---|---|---|---|
| 5,490,038 A | * | 2/1996 | Scholder et al. | 361/759 |
| 6,236,574 B1 | * | 5/2001 | Han | 361/816 |
| 6,385,048 B2 | * | 5/2002 | Mellberg et al. | 361/704 |
| 6,552,914 B1 | * | 4/2003 | Chang | 361/796 |
| 6,606,249 B2 | * | 8/2003 | Chikawa et al. | 361/760 |
| 6,832,927 B2 | * | 12/2004 | Wilson et al. | 439/347 |
| 7,102,895 B1 | * | 9/2006 | Copple | 361/802 |
| 7,251,143 B2 | * | 7/2007 | Magnoux et al. | 361/801 |
| 7,365,993 B2 | * | 4/2008 | Jiang et al. | 361/801 |
| 7,518,877 B2 | * | 4/2009 | Peng et al. | 361/726 |
| 7,532,479 B2 | * | 5/2009 | Ohno et al. | 361/719 |
| 2001/0053067 A1 | * | 12/2001 | Wortman | 361/752 |
| 2007/0046492 A1 | * | 3/2007 | Fair et al. | 340/825.69 |
| 2008/0213738 A1 | * | 9/2008 | Li | 434/301 |

* cited by examiner

*Primary Examiner* — Dameon Levi

(57) ABSTRACT

An electronic device. The electronic device comprises housing, a positioning member and a circuit board. The positioning member, disposed on the housing, comprises a first protruding portion. The circuit board engages with the positioning member. The first protruding portion is a resilient member contacting with the circuit board to constrain the circuit board between the first protruding portion and the housing by an elastic force.

38 Claims, 3 Drawing Sheets

ELECTRONIC DEVICE

CROSS REFERENCE TO RELATED APPLICATIONS

This Application claims priority of Taiwan Patent Application No. 96216882, filed on Oct. 9, 2007, the entirety of which is incorporated by reference herein.

BACKGROUND OF THE INVENTION

1. Field of the Invention

The present invention relates to an electronic device, and in particular, to an electronic device with an easily detachable circuit board.

2. Description of the Related Art

A conventional method for fixing a circuit board on a housing of an electronic device is to utilize screws through the circuit board, screwing the circuit board on the housing. However, the screwing procedure takes places within the housing, such that enough space within the housing is required to assemble or disassemble the circuit board. With miniaturization of electronic products limiting the size of the electronic products, spatial arrangement within the miniaturized electronic product must be adjusted. For compact available space within an electronic product, the upper housing and the bottom housing have to be separated to allow for assembly or disassembly of the circuit board. Specifically, if access is required, other surrounding components may have to be disassembled beforehand, thus causing inconveniences.

BRIEF SUMMARY OF THE INVENTION

Accordingly, the invention provides an electronic device. The electronic device comprises a housing, a positioning member and a circuit board. The positioning member, disposed on the housing, comprises a first protruding portion. The circuit board engages with the positioning member. The first protruding portion is a resilient member contacting with the circuit board to constrain the circuit board between the first protruding portion and the housing by an elastic force.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
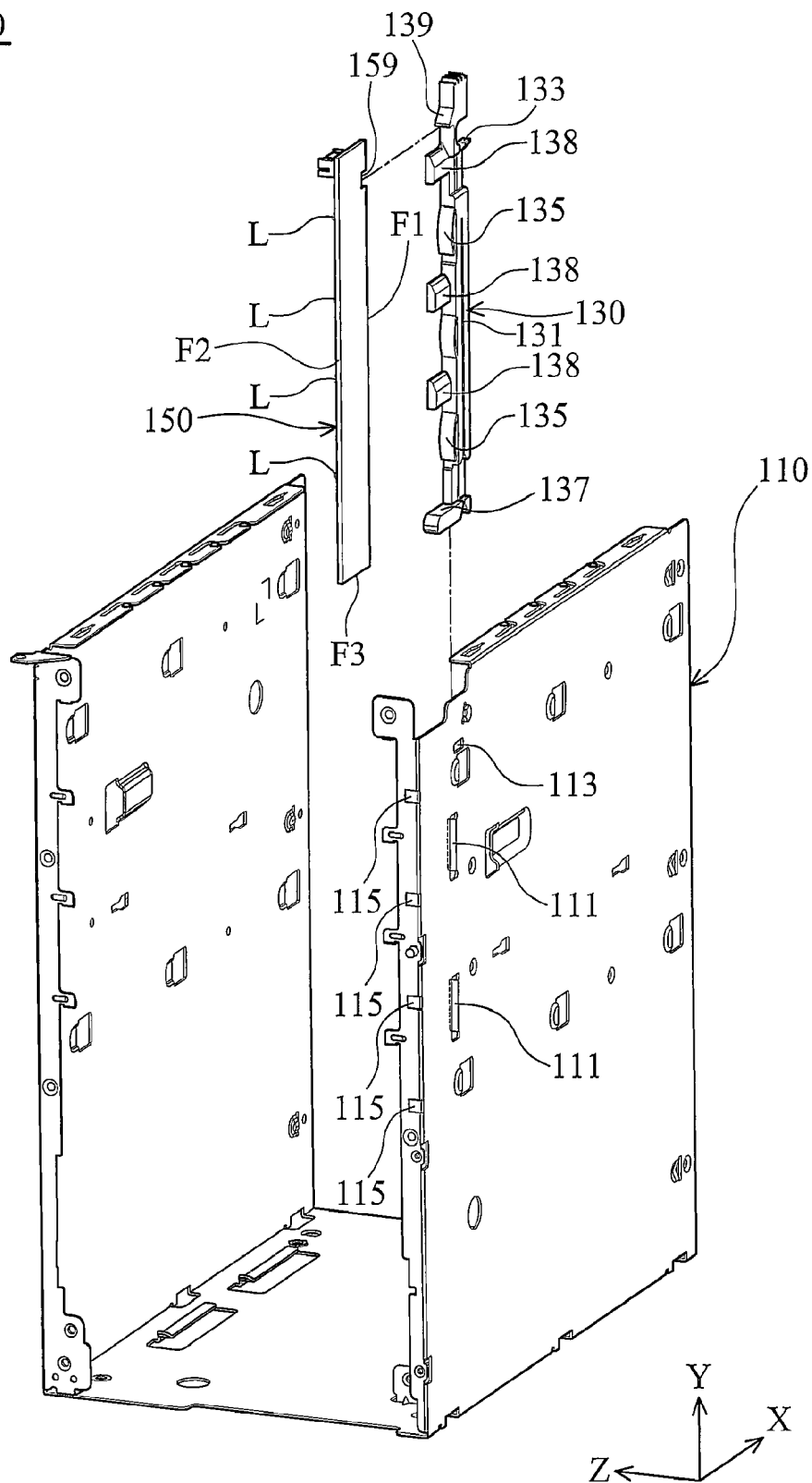
FIG. 1 is an exploded view of an electronic device of the invention.

Referring to FIG. 1, the electronic device 100 of the invention comprises a housing 110, a positioning member 130 and a circuit board 150, wherein the circuit board 150 is firmly fixed between the housing 110 and the positioning member 130.

The housing 110 comprises a first corresponding fastening portion 111, a second corresponding fastening portion 113 and a plurality of though holes 15. The positioning member 130 comprises a first fastening portion 131 and a second fastening portion 133.

Figure 2:
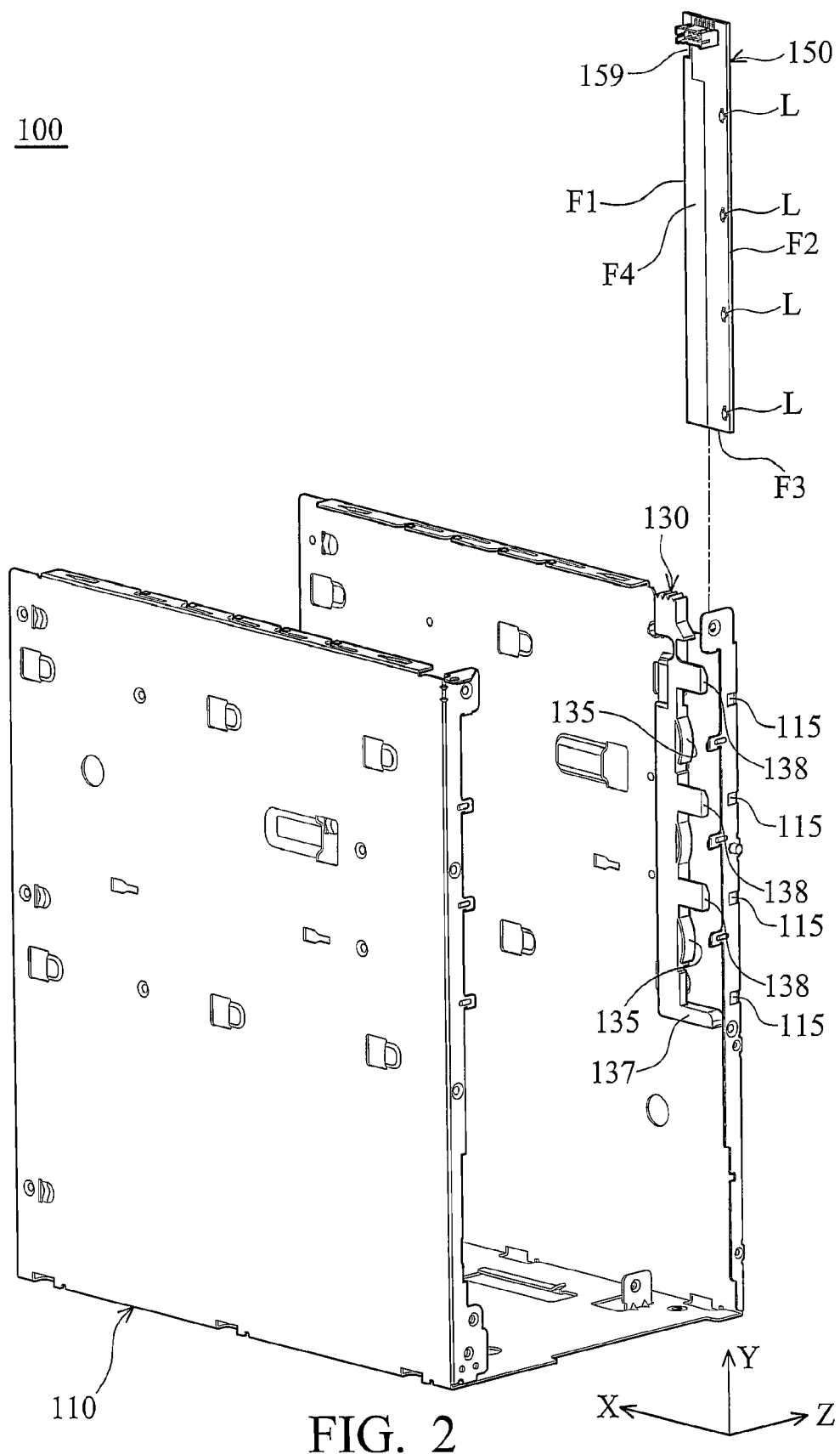
FIG. 2 is an exploded view of the electronic device of the invention in another aspect.

The first fastening portion 131 comprises a recess, and the first corresponding fastening portion 111 comprises two plate-shaped protrusions extending toward the interior of the housing 110 and engaging with the first fastening portion 131 (track). The first corresponding fastening portion 111 slides in the first fastening portion 131. The second fastening portion 133 comprises a protruding block, and the second corresponding fastening portion 113 comprises an opening. When the first fastening portion 131 engages with the first corresponding fastening portion 113 and the first corresponding fastening portion 111 (protrusions) slides to the end of the first fastening portion 131 (recess), the second fastening portion 133 (protruding block) engages with the second corresponding portion 113 (opening) and the second fastening portion 133 (protruding block) is exposed outside of the housing 110 through the second corresponding fastening portion 113 (opening). By engaging the first fastening portion 131 with the first corresponding fastening portion 111, and the second fastening portion 133 with the second corresponding portion 113, the positioning member 130 is connected to the housing 110 (as shown in FIG. 2). When disassembling the positioning member 130, the second fastening portion 133 (protruding block) is pressed to be separated from the second corresponding fastening portion 113, and then lifted to be easily detached from the housing 110.

The above description is a method for fixing the positioning member 130 on the housing 110, but it is not limited thereto. The positioning member 130 can be connected to the housing 110 in other ways, such as adherence or by screws. The positioning member 130 can be adhered on the housing 110 or screwed on the housing 110.

Referring to FIG. 2, the circuit board 150 comprises a first side F1, a second side F2, a third side F3, a fourth sides F4, four light emitting diodes L disposed on the second side F2 and a third corresponding fastening portion 159. The third corresponding fastening portion 159 comprises a notch. The first side F1 is opposite to the second side F2, the third side F3 is perpendicular and adjacent to the first side F1 and the second side F2, and the fourth side F4 is adjacent to the first side F1, the second side F2 and the third side F3, respectively.

It should be noted that in this embodiment, the circuit board 130 comprises light emitting diodes L, but it is not limited thereto. The circuit board 130 may comprise other functional components.

The positioning member 130 further comprises a first protruding portion 135, a second protruding portion 137, a third protruding portion 138 and a third fastening portion 139. The first protruding portion 135 comprises two curved resilient members disposed on a side of the first fastening portion 131. The second protruding portion 137 comprises a supporting strip extending perpendicular to the first fastening portion 131. The third protruding portion 138 comprises a stopping plate extending perpendicular to the first fastening portion 131. The third fastening portion 139 comprises a hook protruding perpendicular to the first fastening portion 131. It should be noted that the number of elastic structures and stopping plates is selected according to the size of the circuit board 150, but it is not limited thereto.

Figure 3:
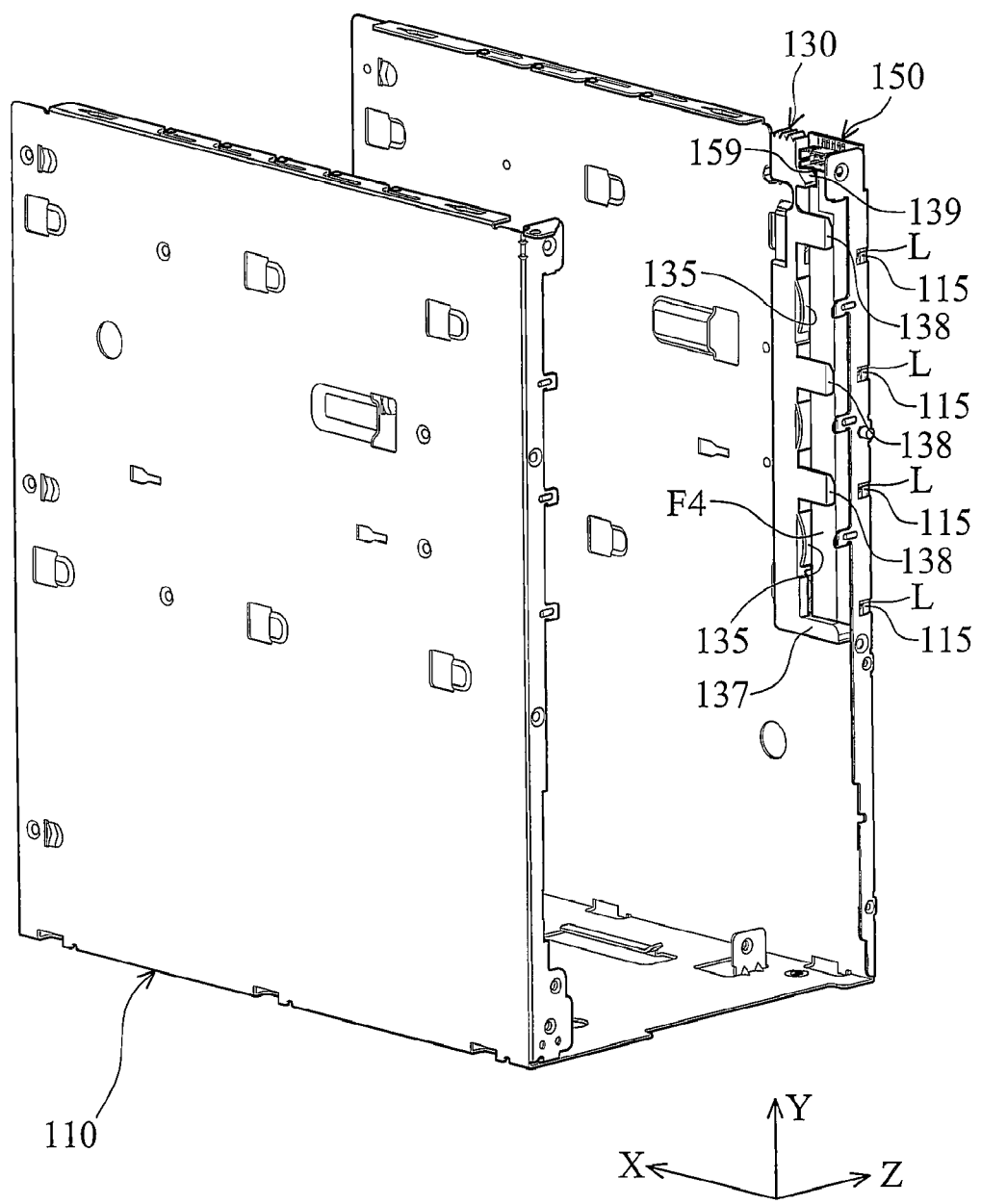
FIG. 3 is a schematic view of the electronic device of the invention.

Referring to FIGS. 2 and 3 simultaneously, when the positioning member 130 is fixed on the housing 110, an accommodating space is formed between the first protruding portion 135, the second protruding portion 137 and the third protruding portion 138 of the positioning member 130 and the housing 110 (as shown in FIG. 2). When assembling the circuit board 150, the circuit board 130 is placed down into the accommodating space, allowing the circuit board 150 to be firmly fixed between the positioning member 130 and the housing 110 (as shown in FIG. 3). In other words, the first protruding portion 135 contacts the circuit board 130 and provides an elastic force thereto to constrain the circuit board 130 between the first protruding portion 135 and the housing 110.

As shown in FIG. 3, the first side F1 of the circuit board 150 abuts the first protruding portion 135 of the positioning member 130, and the first protruding portion 135 contacts the first side F1 of the circuit board 150 and provides elastic force to push the second side F2 of the circuit board 150 to contact with the housing 110, firmly fixing the circuit board 150 along an X axis. As a result, the light emitting diodes L disposed on the second side F2 of the circuit board 150 are exposed outside of the housing 110 through the through holes 115. The third side F3 of the circuit board 150 abuts the second protruding portion 137 of the positioning member 130, and the second protruding portion 137 bears the weight of the circuit board 150. The third fastening portion 139 (hook) of the positioning member 130 engages with the third corresponding fastening portion 159 (notch) of the circuit board 150 to fix the circuit board 150 on the housing along an Y axis. The third protruding portion 138 (stopping plate) of the positioning member 130 abuts the fourth side F4 of the circuit board 150 to fix the circuit board 150 between the third protruding portion 138 (stopping plate) and the housing 110, and therefore the circuit board 150 is firmly fixed along a Z axis.

When disassembling the circuit board 150, the third fastening portion 139 (hook) of the positioning member 130 is separated from the third corresponding fastening portion 159 (notch) of the circuit board 150, and the circuit board 150 is lifted to be detached from the housing 110.

The electronic device 100 of the invention does not utilize the conventional method to screw the circuit board on the housing. Within a limited space, the circuit board of the electronic device 100 is fixed on the housing 110 by engaging with the positioning member 130, which provides a more convenient method to assemble the circuit board 150. Additionally, the positioning member 130 is replaceable depending upon the impaired condition thereof. The circuit board 150 and the positioning member 130 are both assembled by engagement, increasing assembling efficiency and convenience.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a housing, comprising a first corresponding fastening portion;
   a positioning member disposed on the housing, comprising a first protruding portion and a first fastening portion, wherein the first fastening portion engages with the first corresponding fastening portion to fix the positioning member on the housing; and
   a circuit board engaged with the positioning member;
   wherein the first protruding portion is a resilient member contacting with the circuit board to constrain the circuit board between the first protruding portion and the housing by an elastic force, wherein the first fastening portion has a recess, the first corresponding fastening portion comprises a protrusion sliding in the recess.

2. The electronic device as claimed in claim 1, wherein the positioning member is disposed on the housing by adhesive.

3. The electronic device as claimed in claim 1, wherein the positioning member is screwed on the housing.

4. The electronic device as claimed in claim 1, wherein the positioning member further comprises a second fastening portion, the housing comprises a second corresponding fastening portion, and the second fastening portion engages with the second corresponding fastening portion to fix the positioning member on the housing.

5. The electronic device as claimed in claim 4, wherein the second fastening portion comprises a protruding block, and the second corresponding fastening member comprises an opening.

6. The electronic device as claimed in claim 5, wherein the circuit board has a first side and a second side opposite to the first side, and the first protruding portion contacts the first side to push the second side to contact with the housing.

7. The electronic device as claimed in claim 6, wherein the circuit board further has a third side adjacent to the first side and the second side, and the positioning member further comprises a second protruding portion abutting the third side.

8. The electronic device as claimed in claim 7, wherein the circuit board further has fourth side adjacent to the first side, the second side and the third side, the positioning member further comprises a third protruding portion abutting the fourth side, fixing the circuit board on the housing.

9. The electronic device as claimed in claim 1, wherein the positioning member further comprises a third fastening portion, the circuit board comprises a third corresponding portion, and the third fastening portion engages with the third corresponding fastening portion to fix the circuit board on the housing.

10. The electronic device as claimed in claim 9, wherein the third fastening portion comprises a hook, and the third corresponding fastening portion comprises a notch.

11. The electronic device as claimed in claim 1, wherein the circuit board comprises a plurality of light emitting diodes.

12. The electronic device as claimed in claim 11, wherein the housing comprises a plurality of through holes corresponding to the light emitting diodes, and the light emitting diodes are exposed outside of the housing through the through holes.

13. An electronic device, comprising:
   a housing;
   a positioning member disposed on the housing, comprising a first protruding portion; and
   a circuit board engaged with the positioning member;
   wherein the first protruding portion is a resilient member contacting with the circuit board to constrain the circuit board between the first protruding portion and the housing by an elastic force, wherein the circuit board comprises a plurality of light emitting diodes.

14. The electronic device as claimed in claim 13, wherein the positioning member is disposed on the housing by adhesive.

15. The electronic device as claimed in claim 13, wherein the positioning member is screwed on the housing.

16. The electronic device as claimed in claim 13, wherein the positioning member further comprises a first fastening portion, the housing comprises a first corresponding fastening portion, and the first fastening portion engages with the first corresponding fastening portion to fix the positioning member on the housing.

17. The electronic device as claimed in claim 13, wherein the positioning member further comprises a second fastening portion, the housing comprises a second corresponding fastening portion, and the second fastening portion engages with the second corresponding fastening portion to fix the positioning member on the housing.

18. The electronic device as claimed in claim 17, wherein the second fastening portion comprises a protruding block, and the second corresponding fastening member comprises an opening.

19. The electronic device as claimed in claim 18, wherein the circuit board has a first side and a second side opposite to the first side, and the first protruding portion contacts the first side to push the second side to contact with the housing.

20. The electronic device as claimed in claim 19, wherein the circuit board further has a third side adjacent to the first side and the second side, and the positioning member further comprises a second protruding portion abutting the third side.

21. The electronic device as claimed in claim 20, wherein the circuit board further has fourth side adjacent to the first side, the second side and the third side, the positioning member further comprises a third protruding portion abutting the fourth side, fixing the circuit board on the housing.

22. The electronic device as claimed in claim 13, wherein the positioning member further comprises a third fastening portion, the circuit board comprises a third corresponding portion, and the third fastening portion engages with the third corresponding fastening portion to fix the circuit board on the housing.

23. The electronic device as claimed in claim 22, wherein the third fastening portion comprises a hook, and the third corresponding fastening portion comprises a notch.

24. The electronic device as claimed in claim 13, wherein the housing comprises a plurality of through holes corresponding to the light emitting diodes, and the light emitting diodes are exposed outside of the housing through the through holes.

25. An electronic device, comprising:
a housing, comprising a flat surface;
a positioning member disposed on the flat surface of the housing, comprising a first protruding portion; and
a circuit board engaged with the positioning member, wherein the circuit board is parallel to the flat surface;
wherein the first protruding portion is a resilient member contacting with the circuit board to constrain the circuit board between the first protruding portion and the housing by an elastic force.

26. The electronic device as claimed in claim 25, wherein the positioning member is disposed on the housing by adhesive.

27. The electronic device as claimed in claim 25, wherein the positioning member is screwed on the housing.

28. The electronic device as claimed in claim 25, wherein the positioning member further comprises a first fastening portion, the housing comprises a first corresponding fastening portion, and the first fastening portion engages with the first corresponding fastening portion to fix the positioning member on the housing.

29. The electronic device as claimed in claim 28, wherein the first fastening portion has a recess, the first corresponding fastening portion comprises a protrusion sliding in the recess.

30. The electronic device as claimed in claim 25, wherein the positioning member further comprises a second fastening portion, the housing comprises a second corresponding fastening portion, and the second fastening portion engages with the second corresponding fastening portion to fix the positioning member on the housing.

31. The electronic device as claimed in claim 30, wherein the second fastening portion comprises a protruding block, and the second corresponding fastening member comprises an opening.

32. The electronic device as claimed in claim 31, wherein the circuit board has a first side and a second side opposite to the first side, and the first protruding portion contacts the first side to push the second side to contact with the housing.

33. The electronic device as claimed in claim 32, wherein the circuit board further has a third side adjacent to the first side and the second side, and the positioning member further comprises a second protruding portion abutting the third side.

34. The electronic device as claimed in claim 33, wherein the circuit board further has fourth side adjacent to the first side, the second side and the third side, the positioning member further comprises a third protruding portion abutting the fourth side, fixing the circuit board on the housing.

35. The electronic device as claimed in claim 25, wherein the positioning member further comprises a third fastening portion, the circuit board comprises a third corresponding portion, and the third fastening portion engages with the third corresponding fastening portion to fix the circuit board on the housing.

36. The electronic device as claimed in claim 35, wherein the third fastening portion comprises a hook, and the third corresponding fastening portion comprises a notch.

37. The electronic device as claimed in claim 25, wherein the circuit board comprises a plurality of light emitting diodes.

38. The electronic device as claimed in claim 37, wherein the housing comprises a plurality of through holes corresponding to the light emitting diodes, and the light emitting diodes are exposed outside of the housing through the through holes.

* * * * *